(12) United States Patent
Tanaka et al.

(10) Patent No.: US 7,416,135 B2
(45) Date of Patent: Aug. 26, 2008

(54) IC TAG AND IC TAG ATTACHMENT STRUCTURE

(75) Inventors: Makoto Tanaka, Obu (JP); Kazuoki Matsugatani, Kariya (JP); Moonil Kim, Kyunggi-do (KR); Won Ho Kim, Seoul (KR)

(73) Assignee: DENSO CORPORATION, Kariya (JP)

( * ) Notice: Subject to any disclaimer, the term of this patent is extended or adjusted under 35 U.S.C. 154(b) by 364 days.

(21) Appl. No.: 11/300,600

(22) Filed: Dec. 15, 2005

(65) Prior Publication Data

US 2006/0145872 A1 Jul. 6, 2006

(30) Foreign Application Priority Data

Dec. 16, 2004 (JP) ............................. 2004-364581

(51) Int. Cl.
*G06K 19/06* (2006.01)
(52) U.S. Cl. ................ 235/492; 340/572.8; 340/572.7; 343/767; 257/501
(58) Field of Classification Search ................ 235/492; 340/572.8, 572.7; 343/767; 257/501
See application file for complete search history.

(56) References Cited

U.S. PATENT DOCUMENTS 6,188,368 B1 * 2/2001 Koriyama et al. ........... 343/767

FOREIGN PATENT DOCUMENTS

| EP | 1339 132 A1 | 8/2003 |
|---|---|---|
| JP | A-2003-243926 | 8/2003 |
| JP | A-2004-164055 | 6/2004 |

* cited by examiner

*Primary Examiner*—Michael G. Lee
*Assistant Examiner*—Kristy A Haupt
(74) *Attorney, Agent, or Firm*—Posz Law Group, PLC

(57) ABSTRACT

A first metal plate for transmission and a second metal plate for transmission are closely-attached to a first surface and a second surface of a dielectric body, respectively. An outer edge of the first metal plate substantially symmetrically faces an outer edge of the second metal plate via the dielectric body. A metal plate for matching is arranged inside a hole formed on the second metal plate, with a slit formed with an inner wall of the hole, and is fixed to the dielectric body. The metal plate for matching is electrically connected to the first metal plate via a through hole penetrating the dielectric body. An IC chip is surface-mounted to connect the second metal plate with the metal plate for matching.

11 Claims, 12 Drawing Sheets

IC TAG AND IC TAG ATTACHMENT STRUCTURE

CROSS REFERENCE TO RELATED APPLICATION

This application is based on and incorporates herein by reference Japanese patent application No. 2004-364581 filed on Dec. 16, 2004.

FIELD OF THE INVENTION

The present invention relates to an IC tag used for RFID (Radio Frequency IDentification) and utilizing a microwave frequency range in wireless communications, and in particular to an art for constructing a system which is capable of providing steady data exchange wherever it is installed. For example, the system is installed on a dielectric material or a metal.

BACKGROUND OF THE INVENTION

RFID is an auto-recognition system for reading/writing (specifically, retrieving, registering, deleting, or updating) individual information from/to a person or a substance memorized in a medium called an IC tag by using wireless communications. FIG. 18 is a schematic view showing an example of the system.

Two devices are necessary in order to provide the RFID. One is a reader/writer 100 and another is an IC tag 120. The reader/writer 100 writes information to a memory 121a incorporated in an IC chip 121 of the IC tag 120, or reads the information written in the memory 121a. The IC tag 120 obtains an electric power for its operation by rectifying part of carrier waves when it is a passive type IC tag having no internal battery. Thus, the IC tag 120 can communicate with the reader/writer 100, write data to the memory 121a, and modulate data for transmission.

An antenna 122 is incorporated in the IC tag 120 in order to maintain the communications between the reader/writer 100 and the IC tag 120 at a long distance. A dipole antenna and a patch antenna are typically used for the IC tag 120 utilizing a microwave frequency range (e.g., the 960 MHz range and the 2.45 GHz range).

FIG. 19 is a schematic view showing a dipole antenna 219. The dipole antenna 219 can be easily manufactured by printing, because it has a simple structure having two linear metals 130 and 131. Therefore the dipole antenna 219 is widely used as an inexpensive antenna for the IC tag.

FIGS. 20A, 20B are schematic views showing a patch antenna 220. The patch antenna 220 has a structure in which two metal plates (i.e., a ground metal plate 140 and a patch metal plate 141) are arranged parallel to each other together with a dielectric body 142 therebetween.

Directivity is used as an indicator of characteristics of an antenna. The directivity indicates which direction the antenna can cover as a communications area (or a recognition area) and how much power the antenna can provide. FIGS. 21 and 22 are schematic views showing the directivity of the dipole antenna 219 and the patch antenna 220, respectively. As shown in the dashed lines in FIGS. 21 and 22, the dipole antenna 219 is capable of transmitting electrical waves to its upper side and lower side in FIG. 21, while the patch antenna 220 is capable of transmitting electrical waves mainly to its upper side (toward the patch metal plate 141) in FIG. 22. From the viewpoint of a recognition area of the reader/writer 100, the dipole antenna 219 can be recognized in a broader angle than the patch antenna 220. In other words, if IC tags with the dipole antenna 219 and IC tags with the patch antenna 220 are disposed in random orientations, the IC tags with the dipole antenna 219 can be recognized more easily.

In many cases, IC tags are used by being attached to an object. This object is, for example, a dielectric material such as a PET bottle, or a metal object such as a metal container. The object, especially the metal object, tends to degrade the characteristics of the antennas. Hereafter, the functions of the dipole antenna 219 and the patch antenna 220 will be described.

As shown in FIG. 23, when the dipole antenna 219 is located near a metal 132, an incident wave 135 advancing to the metal 132 and an reflection wave 136 reflected by the metal 132 are generated. At the edge of the metal 132, the incident wave 135 is in the opposite phase to the reflection wave 136, because of a boundary condition that the electric field on the metal 132 is zero. Therefore, when the dipole antenna 219 and the metal 132 are located very close to each other, a transmission wave 137 advancing upward in FIG. 23 from the dipole antenna 219 is also in almost the opposite phase to the reflection wave 136. Therefore, the transmission wave 137 and the reflection wave 136 are canceled by each other and thereby an electrical wave is not transmitted upward from the dipole antenna 219. In other words, the dipole antenna 219 does not function when it is located near the metal 132.

In JP-2004-164055 A, in order to solve the problem, a spacer is inserted between an antenna and a metal to keep an interval between them within a range $\lambda/4 \pm \lambda/8$, wherein the value $\lambda$ is wavelength of waves from the antenna. By keeping the interval at the $\lambda/4$, a reflection wave reflected by the metal is in the same phase as that of the wave from the antenna, at the location of the antenna. However, as for the UHF (960 MHz) frequency range, the antenna with the spacer is not practical because $\lambda/4$ roughly equals no less than 8 cm.

In contrast, since the patch antenna 220 has a ground (i.e., the ground metal plate 140) as shown in FIG. 24, the characteristics of transmission of the patch antenna 220 is hardly changed even if the ground metal plate 140 and a metal 143 come in contact with each other.

As described above, the patch antenna 220 is superior to the dipole antenna 219 in the case that they are located near the metal.

Hereafter, matching between the IC chip and the antenna will be described. The above description on the transmission from the antenna is made under an assumption that impedance matching between the IC chip and the antenna is successfully made. In most of ordinary wireless communicators, impedance between a transmitting/receiving device and an I/O port of an antenna is predetermined to be, for example, 50Ω. In contrast, the IC chip for the IC tag does not have a matching circuit, because the IC chip is required to be manufactured with a low cost. Therefore, it is necessary to adjust the impedance of the antenna for the IC tag for achieving the matching with the IC chip. Specifically, when the impedance of the IC chip is (R−jX) [Ω], the impedance of the antenna has to be (R+jX) [Ω] which is the complex conjugate of the impedance of the IC chip.

SUMMARY OF THE INVENTION

The antenna for the IC tag used for the RFID is required to:
(1) have wide directivity in free space;
(2) function near a metal (this naturally ensures functioning near a dielectric material);
(3) achieve the impedance matching with the IC chip; and
(3) be thin.

It is therefore an object of the present invention to provide an IC tag which satisfies the above requirements.

To achieve the above object, an IC tag is provided with the following. a dielectric body is included to have a shape of a plate. A first transmission metal plate for transmission is included to be fixed to a first surface of the dielectric body. A second transmission metal plate for transmission is included to be fixed to a second surface of the dielectric body for constituting an antenna together with the first transmission metal plate, wherein an outer edge of the second transmission metal plate is substantially symmetric with an outer edge of the first transmission metal plate via the dielectric body, wherein the second transmission metal plate includes a hole. A matching metal plate for matching is included to be fixed to the dielectric body within the hole, forming a slit together with an inner surface of the hole, and being connected with the first transmission metal plate via a through hole penetrating the dielectric body. Furthermore, an IC chip is included to be surface-mounted to connect the second transmission metal plate with the matching metal plate over the second surface of the dielectric body.

Moreover, in another aspect of the present invention, alternatively, the second transmission metal plate may be fixed to the second surface of the dielectric body so that misalignment in a direction parallel with surfaces of the dielectric body is within $\lambda/30$.

The IC tag of the present invention has wide directivity at free space. To be more specific, an electric field around a patch antenna is generated between a patch metal plate and a ground metal plate (see FIGS. 9 and 10). When the size of the ground metal plate is larger than that of the patch metal plate (see FIG. 9), an electric wave is transmitted along a direction which goes from the ground metal plate to the patch metal plate. However, if the two plates substantially have the same size and overlap each other as is the case in the IC tag of the present invention (see FIG. 10), the electric wave is transmitted to a wider area than the electric wave transmitted by the patch antenna shown in FIG. 9.

In addition, the IC tag of the present invention functions near a metal because the first and second transmission metal plates function as a patch antenna (see FIG. 11). It is needless to say that the IC tag functions near the dielectric metal.

In addition, in the IC tag of the present invention, the IC chip is surface-mounted and connected with the first transmission metal plate through the matching metal plate. Therefore, the impedance matching between the IC chip and the antenna can be achieved.

In addition, the thicknesses of the IC tag of the present invention is a sum of the thickness of dielectric body, the first transmission metal plate, the second transmission metal plate (otherwise the matching metal plate), and the IC chip. Therefore, the IC tag can be thinner than the conventional IC tag in JP-2004-164055.

Thus, the antenna in the IC tag of the present invention has wide directivity in free space, functions near a metal or a dielectric material, achieves the impedance matching with the IC chip, and can be designed to be thin.

In addition, when the misalignment between the outer edge of the first transmission metal plate and the outer edge of the second transmission metal plate is within $\lambda/30$, the difference of gains of the electric waves between the locations of the first transmission metal plate and the second transmission metal plate can be within 3 dB.

BRIEF DESCRIPTION OF THE DRAWINGS

The invention, together with additional objective, features and advantages thereof, will be best understood from the following description, the appended claims and the accompanying drawings. In the drawings:

DETAILED DESCRIPTION OF THE INVENTION

First Embodiment

Figure 1A:
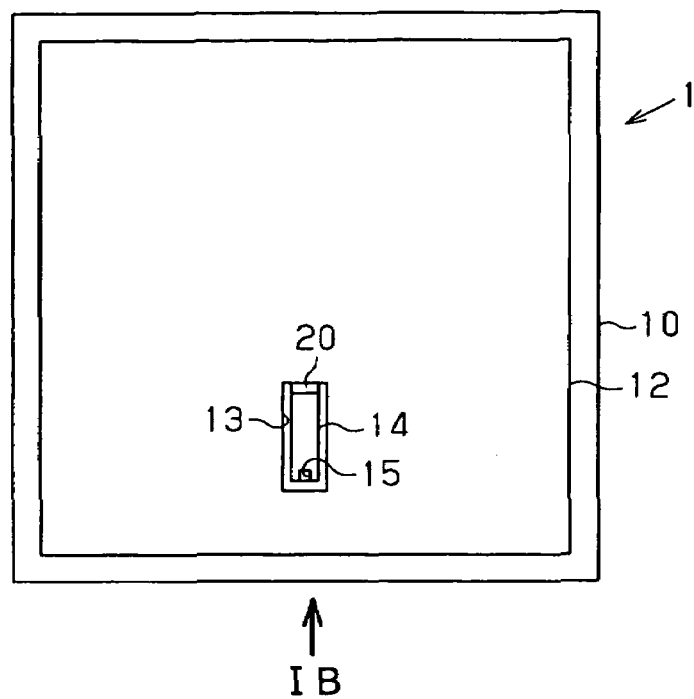
FIG. 1A and FIG. 1B are a top view and a front view showing an IC tag of a first embodiment of the present invention.
Figure 1B:
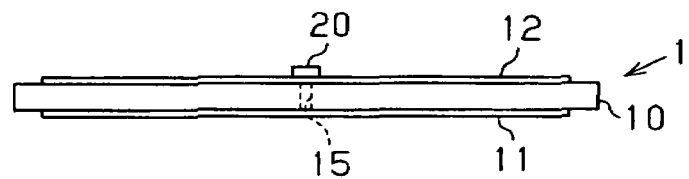
Figure 2:
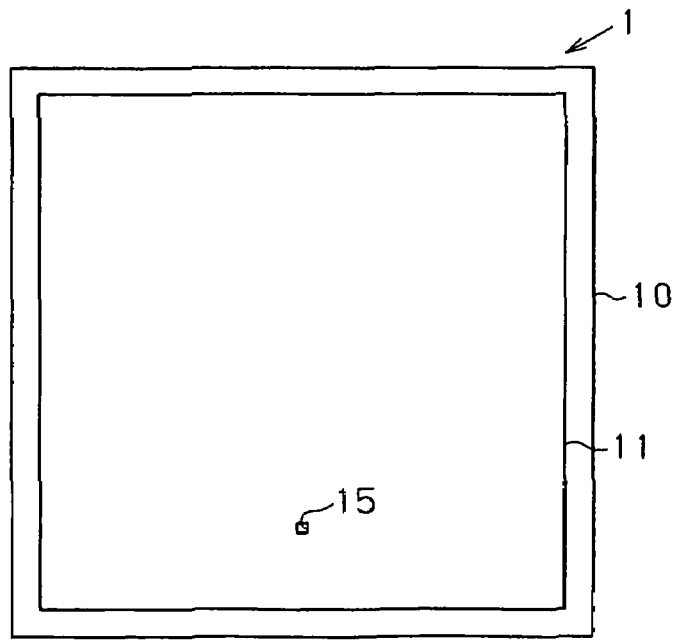
FIG. 2 is a bottom view showing the IC tag.

Hereafter, a first embodiment of the present invention is described with reference to FIGS. 1A-4B. As shown in FIGS. 1A, 1B and 2, an IC tag 1 of the first embodiment includes a dielectric body 10 of a plate shape, which is square and planar.

A first metal plate 11 for transmission is fixed to a bottom surface of the dielectric body 10 having a square planar shape.

A second metal plate 12 for transmission is fixed to an upper surface of the dielectric body 10 with its outer edge (or peripheral edge) nearly (or substantially) facing symmetrically with (or overlapping with) an outer edge of the first metal plate 11 via the dielectric body 10. Therefore, an area surrounded by the outer edge of the second metal plate 12 has nearly (or substantially) the same size as an area surrounded by the outer edge of the first metal plate 11 has. The second metal plate 12 has a hole 13 of an oblong (or rectangular) shape. The metal plates 11 and 12 together constitute an antenna.

Figure 3:
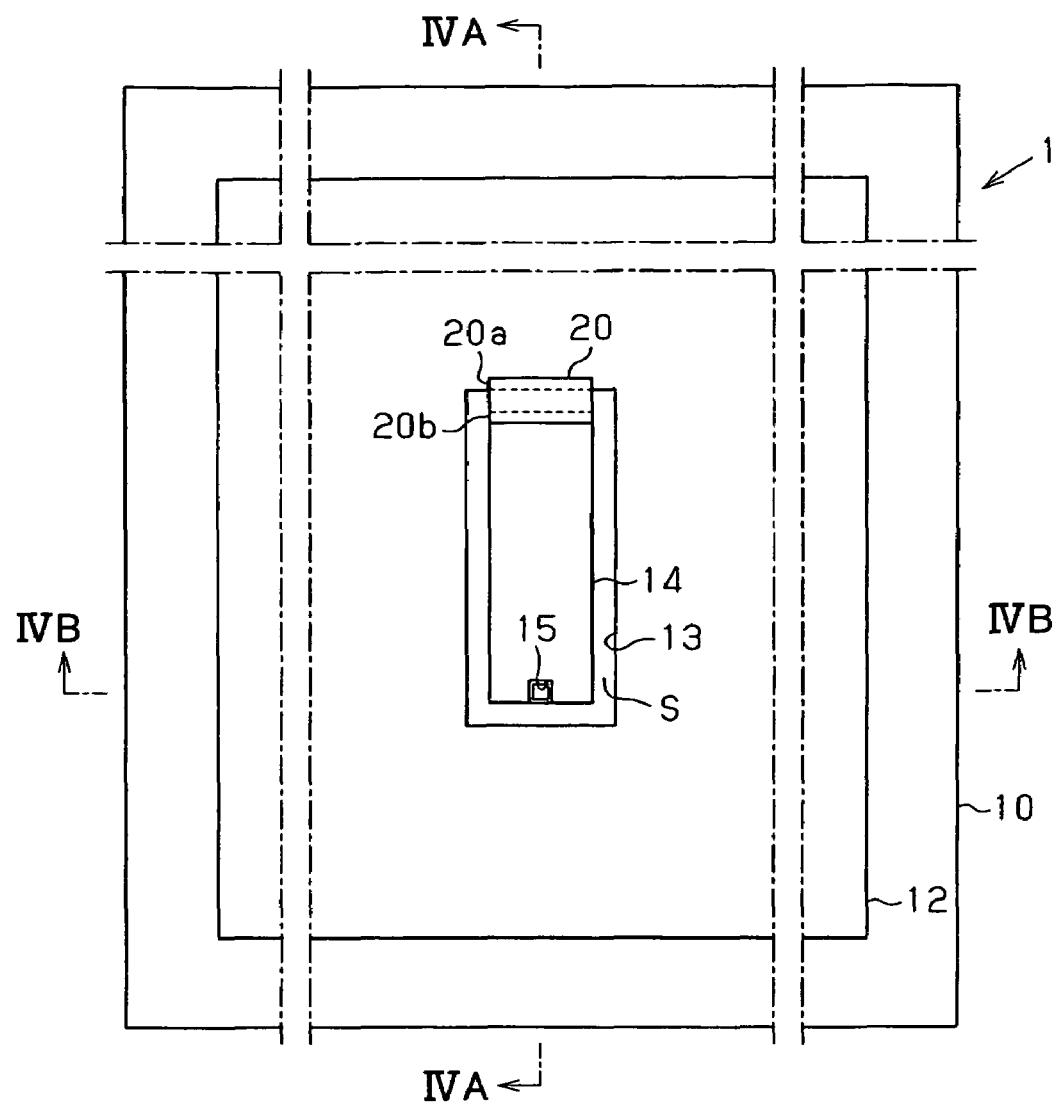
FIG. 3 is a top view showing a main part of the IC tag.
Figure 4A:
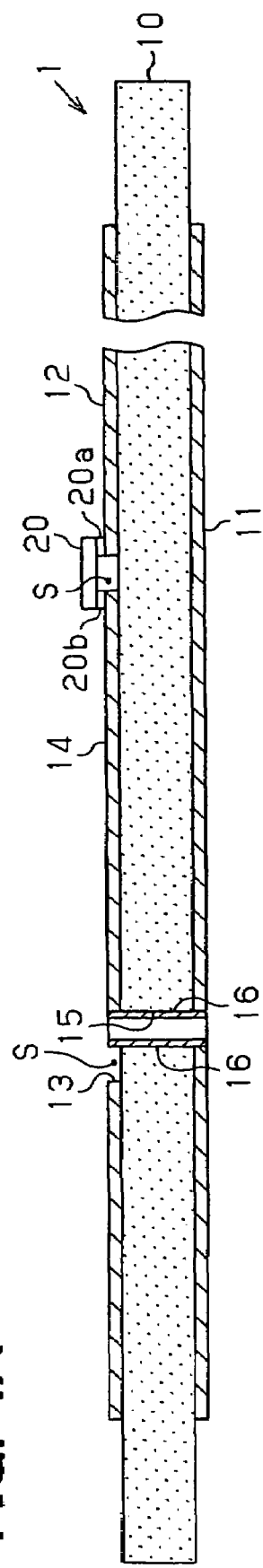
FIG. 4A is an IVA-IVA cross sectional view of FIG. 3.
Figure 4B:
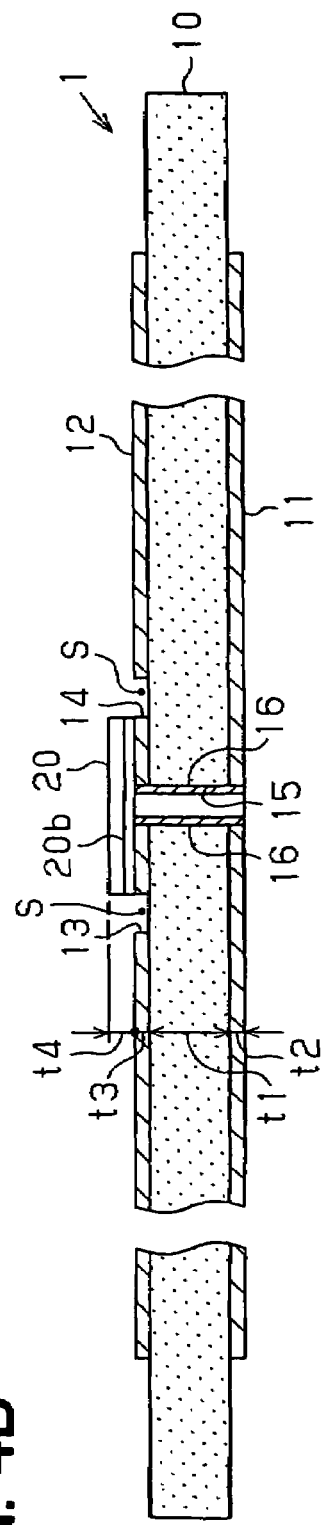
FIG. 4B is an IVB-IVB cross sectional view of FIG. 3.

In the hole 13, a metal plate 14 for impedance matching is fixed to the dielectric body 10. As shown in FIGS. 3, 4A, and 4B, the metal plate 14 has a rectangular planer shape and extends linearly. A slit S is formed between the inner surface of the hole 13 and the outer edge of the metal plate 14. The slit S around the metal plate 14 has a constant width and isolates the metal plate 14 from the second metal plate 12. Here, the metal plate 14 is smaller in its size than the second metal plate 12. As shown in FIGS. 1A, 1B, the metal plate 14 is located (or formed) at a position deviated from the center of the square surface of the second metal plate 12.

The dielectric body 10, the first metal plate 11, the second metal plate 12, and the metal plate 14 constitute a substrate for the IC tag 1. The substrate is a double-sided printed wiring board which is constructed by patterning electrically conductive materials (specifically metal plates) such as copper foil at both sides of a dielectric substrate such as a glass epoxy substrate and a ceramic substrate. Thus, the first metal plate 11, the second metal plate 12, and the metal plate 14 are made of the same material, have the same thickness, and are closely-attached with the dielectric body 10.

As shown in FIGS. 3, 4A, and 4B, a through hole 15 is formed in the dielectric body 10 in a lower end portion of the metal plate 14 in FIG. 3. A coating film 16 is formed on the inner surface of the through hole 15. The metal plate 14 and the first metal plate 11 are electrically connected with each other through the coating film 16 on the through hole 15. Thus, the metal plate 14 is electrically connected with the first metal plate 11 via the through hole 15 penetrating the dielectric body 10.

An IC chip 20 is located over the upper surface of the dielectric body 10, where the second metal plate 12 and the metal plate 14 are located. The IC chip 20 is surface-mounted so as to connect the second metal plate 12 with an upper end of the metal plate 14 in FIG. 1A (i.e., opposite to the through hole 15 within the metal plate 14. Specifically, the IC chip 20 includes two joining terminals 20a and 20b. The joining terminal 20a is connected with the second metal plate 12 by soldering, and the joining terminal 20b is connected with the metal plate 14 by soldering.

Parameters to be adjusted in establishing the impedance matching between the antenna and the IC chip 20 are described with reference to FIG. 5. The parameters to be adjusted are, with reference to FIG. 3, a width W1 of the metal plate 14, a width W2 of the slit S, an interval L1 between the left outer edge of the second metal plate 12 and the left outer edge of the metal plate 14 along the left to right direction, a length L2 of the metal plate 14, and an offset interval L3 between the lower outer edge of the second metal plate 12 and the lower outer edge of the metal plate 14 along the top to bottom direction. By adjusting the parameters, the impedance matching is achieved.

Figure 5:
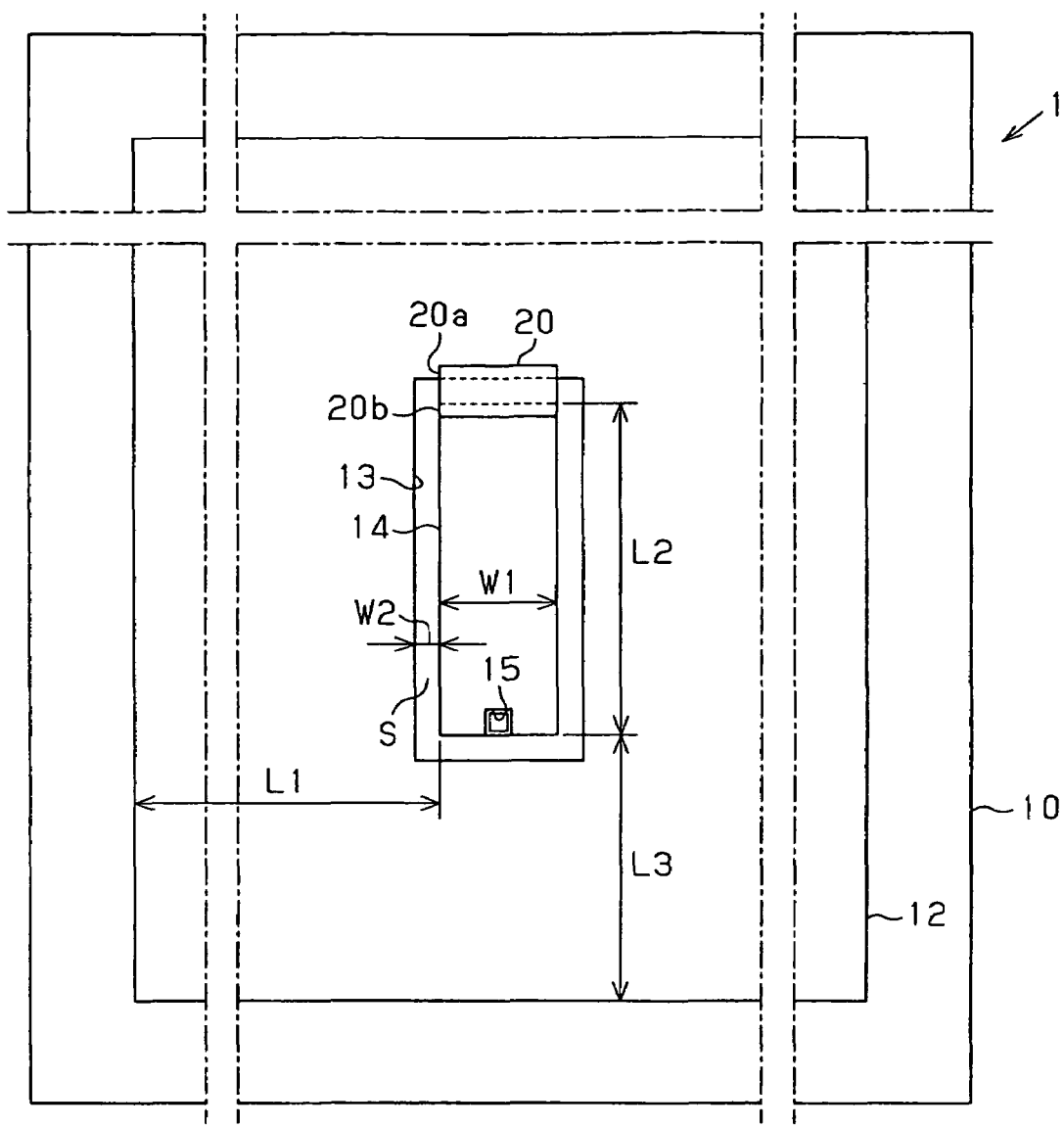
FIG. 5 is a top view showing adjustment parameters for matching of the IC tag.

In particular, in FIG. 5, the matching is established easily by adjusting the length L2 of the metal plate 14, because the metal plate 14 has the shape extending linearly.

Hereafter, usages (or locations) of the IC tag 1 will be described.

Figure 6:
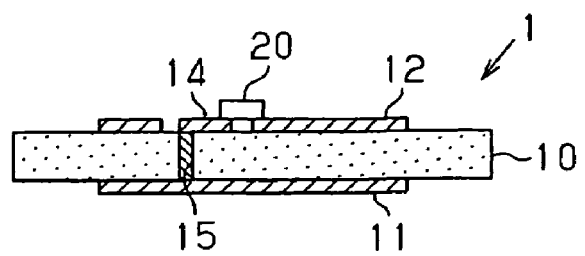
FIG. 6 is a vertical sectional view of the IC tag located in free space.
Figure 7:
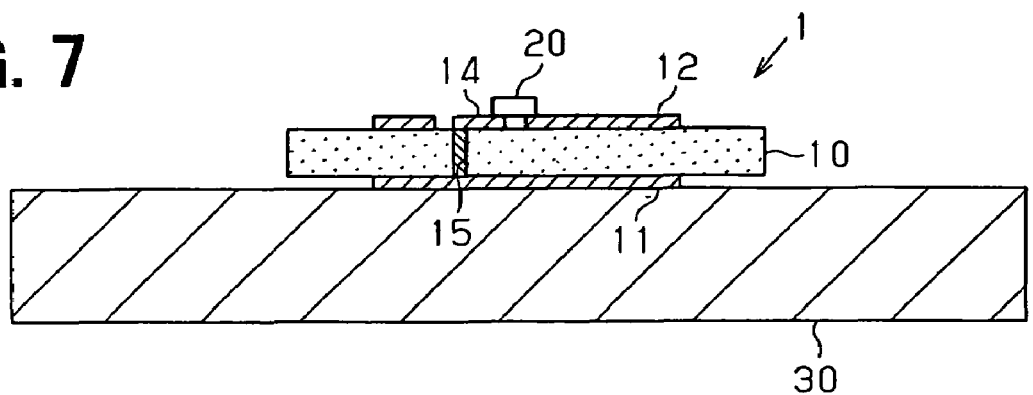
FIG. 7 is a vertical sectional view of the IC tag located on a metal.

FIG. 6 shows an arrangement that the IC tag 1 is in free space, whereas FIG. 7 shows an arrangement or attachment structure that the IC tag 1 is on a metal 30. In FIG. 7, the surface of the dielectric body 10 opposite to the other surface where the metal plate 14 is located faces the metal 30, and the first metal plate 11 is closely-attached with the metal 30.

Figure 8:
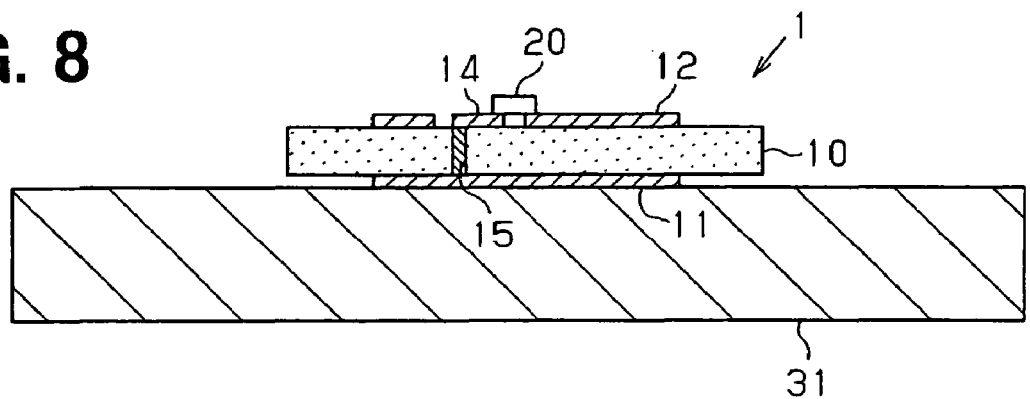
FIG. 8 is a vertical sectional view of the IC tag located on a dielectric material.

FIG. 8 shows an arrangement or attachment structure that the IC tag 1 is located on a dielectric material 31. In this case, the surface of the dielectric body 10 opposite to the other surface where the metal plate 14 is located faces the dielectric material 31, and the first metal plate 11 is in close contact with the dielectric material 31.

Hereafter, characteristics and advantages of the IC tag 1 will be described.

(1) The IC tag 1 has wide directivity in the free space.

Figure 9:
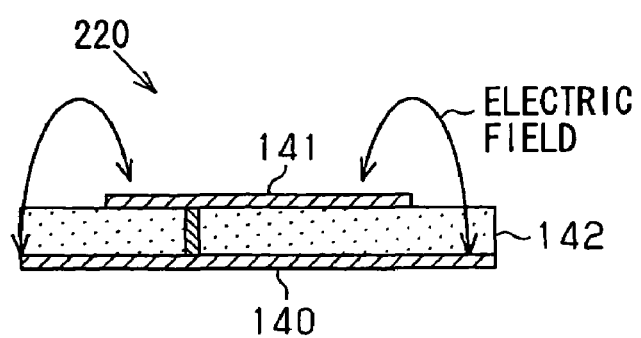
FIG. 9 is a distribution chart showing an electric field for an IC tag of a related art in free space.
Figure 10:
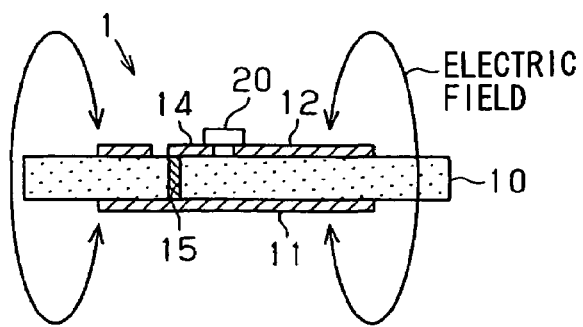
FIG. 10 is a distribution chart showing an electric field for the IC tag of the first embodiment located in free space.

As shown in FIG. 10, the IC tag 1 has wide directivity in the free space compared with the IC tag having the patch antenna 220 of a related art shown in FIG. 9. An electric field around the patch antenna 220 is generated between a patch metal plate 141 and a ground metal plate 140. Here, since the ground metal plate 140 is larger in size than the patch metal plate 141, electric waves are eventually transmitted upward, that is, along a direction from the ground metal plate 140 to the patch metal plate 141, as shown in FIG. 9.

In contrast, as shown in FIG. 10, the antenna of the IC tag 1 generates an electric field which is symmetric with respect to the dielectric body 10. Therefore, the IC tag 1 transmits an electric wave to a wider area than the patch antenna 220 of a related art does.

(2) The IC tag 1 functions on the metal 30.

Figure 11:
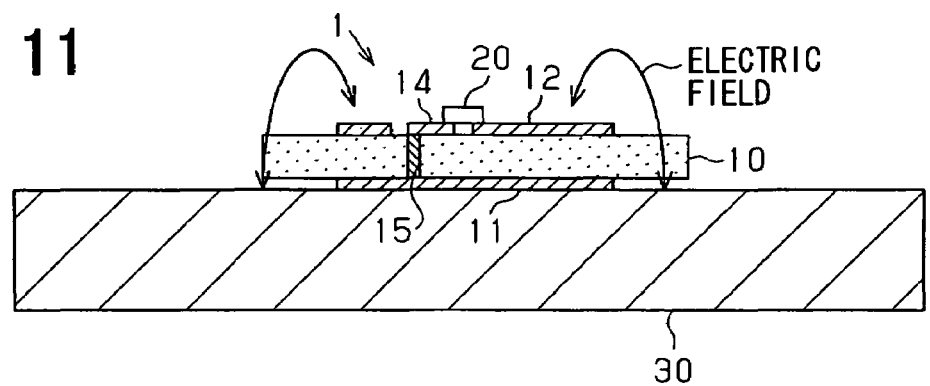
FIG. 11 is a distribution chart showing an electric field for the IC tag of the first embodiment located in free on the metal.

When the IC tag 1 is located on the metal 30, the electric field is generated as shown in FIG. 11. In this case, the antenna of the IC tag 1 functions as a patch antenna. Therefore, the antenna of the IC tag 1 functions on the metal 30. Likewise, the antenna of the IC tag 1 also functions when the IC tag 1 is located, as shown in FIG. 8, on the dielectric material 31.

Thus, the IC tag 1 occupies a smaller space for its installation than ever, by being located on the metal 30 or the dielectric material 31 with the first metal plate 11 closely-attached with the metal 30 or the dielectric material 31.

(3) The impedances of the antenna and the IC chip 20 are matched.

In the IC tag 1, the IC chip 20 is surface-mounted, and the IC chip 20 and the antenna are connected with each other through the metal plate 14. Therefore, it is possible to match the impedances of the antenna and the IC chip 20.

(4) The IC tag 1 can be small and thin.

As shown in FIG. 4B, the thickness of the IC tag 1 equals a sum (t1+t2+t3+t4) of the thickness t1 of the dielectric body 10, the thickness t2 of the first metal plate 11, the thickness t3 of the second metal plate 12 (or the thickness of the metal plate 14), and the thickness t4 of the IC chip 20. Therefore, the IC tag 1 can be designed to be thin and therefore to have an optimum shape for an RFID tag, because the spacer used in JP-2004-164055 A is disused.

Thus, the IC tag 1 has wide directivity in free space, functions near a metal or a dielectric material and achieves the impedance matching with IC chip. This enables the IC tag 1 to be thin.

In addition, in the IC tag 1, the first metal plate 11, the second metal plate 12, and the metal plate 14 are made of the same material, have the same thickness, and are in close contact or closely-attached with the dielectric body 10. In addition, the IC tag 1 is constructed by processing a printed circuit board (specifically double-sided printed wiring board).

In addition, since the metal plate 14 is smaller in size than the second metal plate 12, decrease in efficiency of transmission or radiation can be avoided.

Hereafter, a result of operation check made for the IC tag 1 will be described.

The IC tag 1 used for the operation check is called as a rectifying antenna, which obtains DC voltage by rectifying, using a diode, an electric wave received at its antenna. A passive-type RFID operates without an internal battery, because it obtains an electric power by means of the function of the rectifying antenna.

Figure 12:
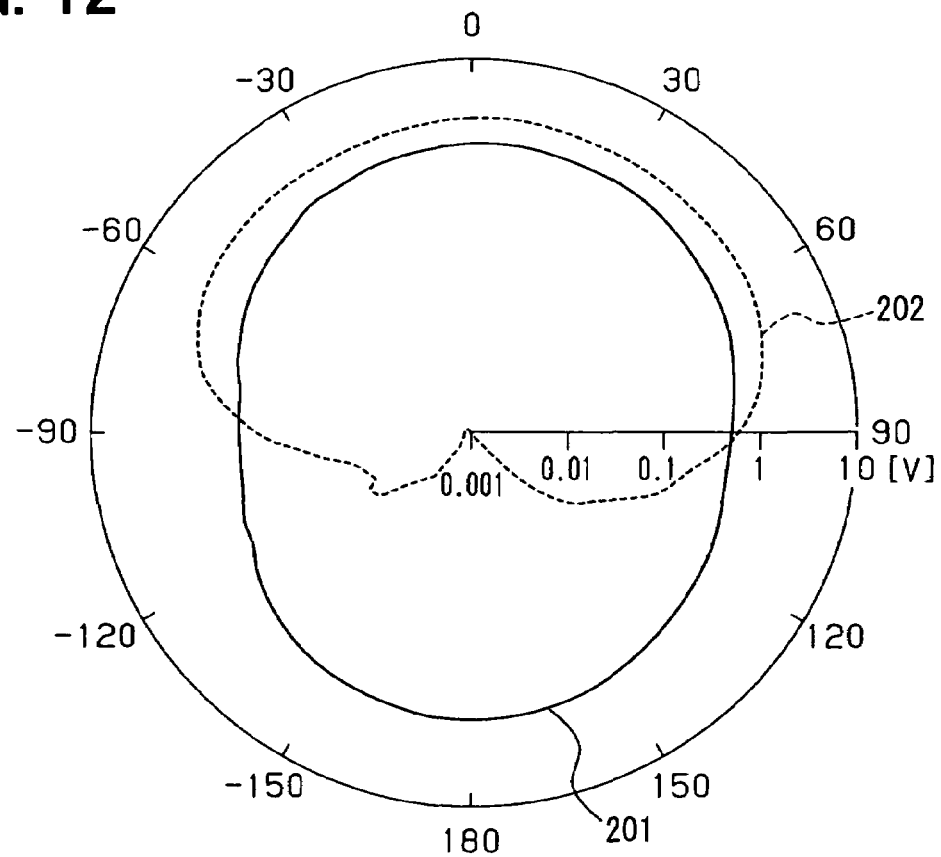
FIG. 12 is a chart showing measured directivity of the IC tag.

FIG. 12 shows the directivity of the IC tag 1 putted in the free space or on the metal, represented by output voltage values. A solid line 201 in FIG. 12 shows the directivity of the antenna when the IC tag 1 is located in the free space. A dashed line 202 in FIG. 12 shows the directivity of the antenna when the IC tag 1 is located on the metal.

As is understood from the FIG. 12, the IC tag 1 in the free space receives electric waves from almost all directions and the IC tag 1 on the metal mainly receives electric waves from opposite directions to the metal (i.e., upper directions in FIG. 12). Thus, it can be seen that the antenna of the IC tag 1 functions both in the free space and on the metal.

Second Embodiment

Figure 13A:
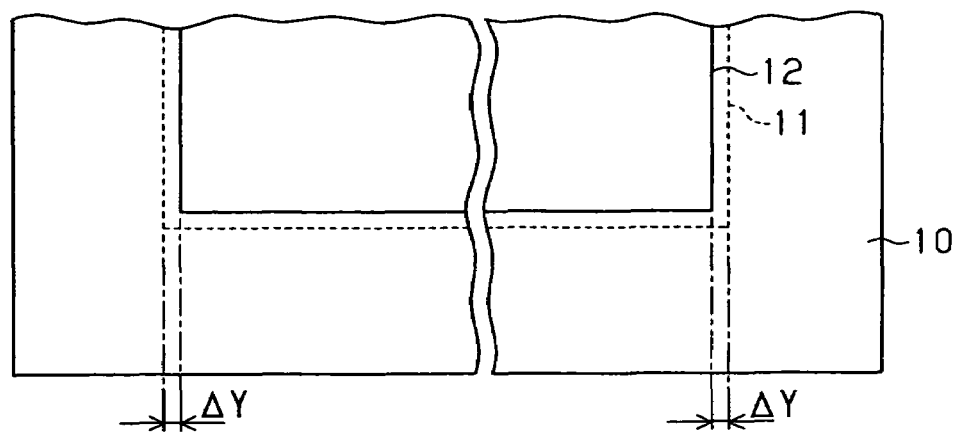
FIG. 13A and FIG. 13B are a top view and a front view showing an IC tag of a second embodiment of the present invention.
Figure 13B:
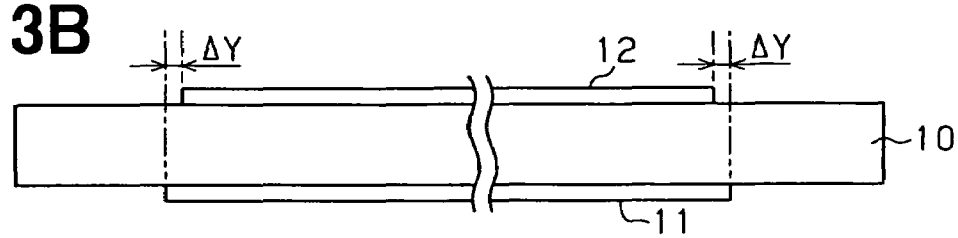

The IC tag 1 of a second embodiment differs from the first embodiment in that, as shown in FIGS. 13A and 13B, the first metal plate 11 and second metal plate 12 are fixed to the dielectric body 10, within a given misalignment ΔY. This given misalignment ΔY is λ/30 measured in a direction along the surfaces of the dielectric body 10 between the outer edge of the first metal plate 11 and the outer edge of the second metal plate 12. Here, the value λ is wavelength of an electric wave in the dielectric body 10.

Specifically, in FIGS. 13A, 13B, the outer edge of the second metal plate 12 is slightly smaller than that of the first metal plate 11 with the misalignment ΔY within λ/30. Alternatively, the outer edge of the second metal plate 12 may be slightly larger than that of the first metal plate 11 also with the misalignment ΔY within λ/30.

Figure 13C:
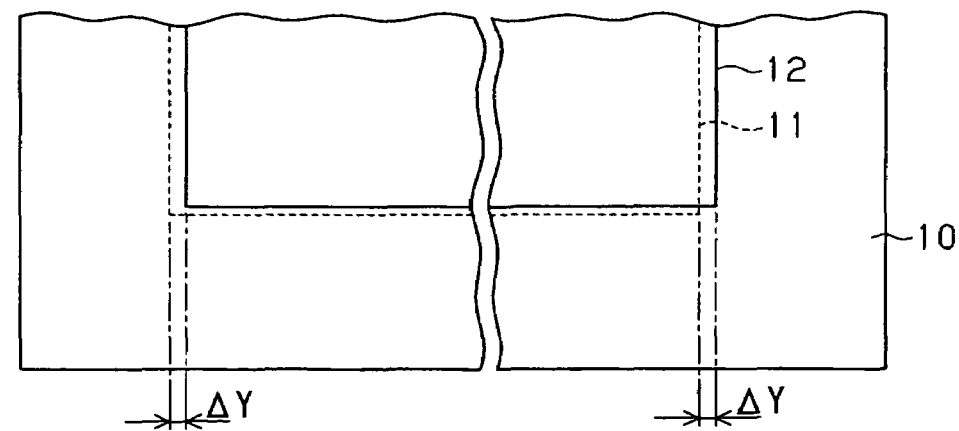
FIG. 13C and FIG. 13D are a top view and a front view showing an IC tag of the second embodiment of the present invention.
Figure 13D:
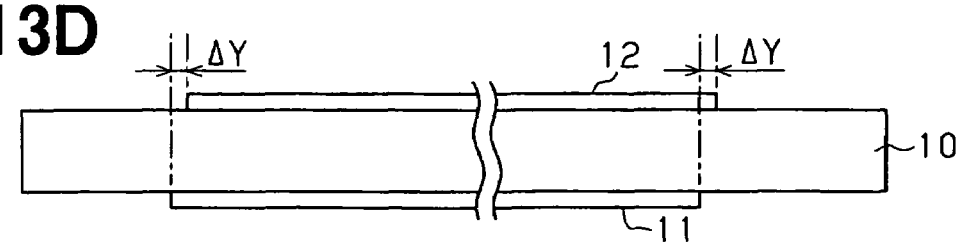

In FIGS. 13C, 13D, the outer edge of the second metal plate 12 is as large as the outer edge of the first metal plate 11 with the misalignment ΔY of the outer edges being within λ/30.

In the second embodiment, the difference of gains of the electric waves between the locations of the first metal plate 11 and the second metal plate 12 (i.e., between the upper half and the lower half in FIG. 10) can be 3 dB. In other words, one of the gains can be roughly twice as high as the other of the gains.

Other Embodiments

The present invention should not be limited to the embodiments discussed above and shown in the figures, but may be implemented in various ways without departing from the spirit of the invention.

Figure 14:
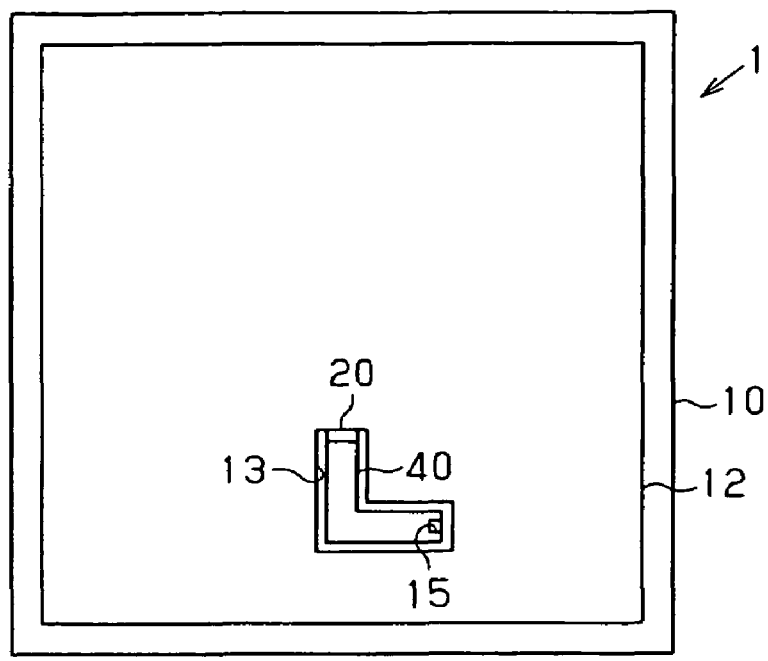
FIGS. 14 and 15 are top views showing other IC tags of the present invention.
Figure 15:
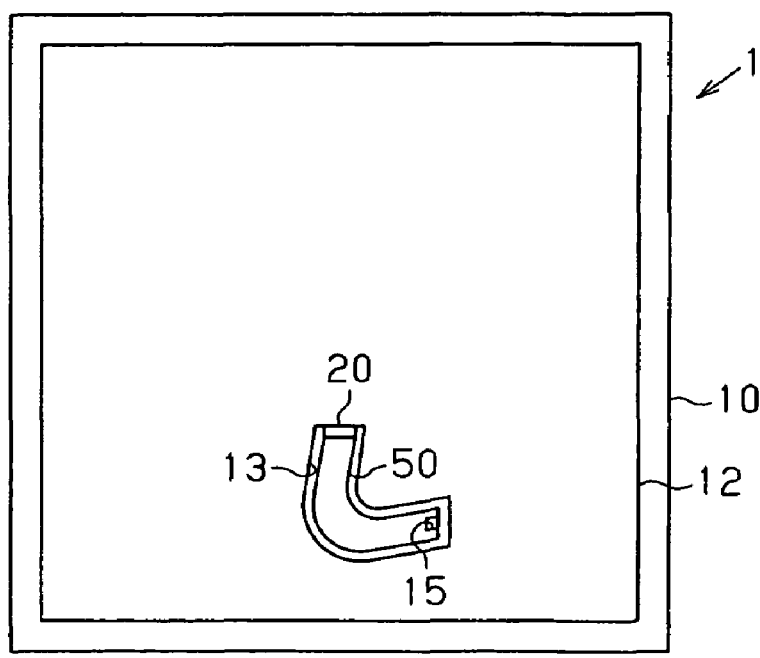

For example, the metal plate 14 for matching may have a bended L-shape like a metal plate 40 in FIG. 14. Alternatively, the metal plate 14 may have a curved shape like a metal plate 50 in FIG. 15. The curved metal plate 50 can reduce amount of transmission, compared to the L-shaped metal plate 40.

Figure 16A:
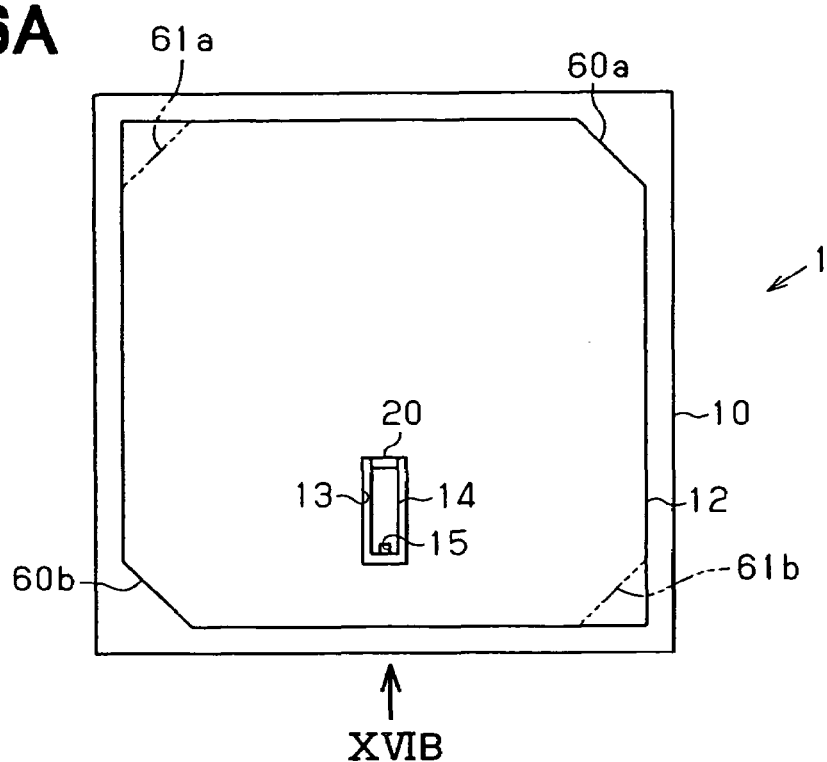
FIG. 16A and FIG. 16B are a top view and a front view showing another IC tag of the present invention.
Figure 16B:
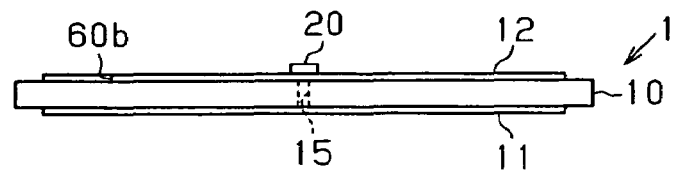

In addition, as shown in FIGS. 16A, 16B, cut-off portions 60a and 60b (or alternatively 61a and 61b) may be formed at diagonal corners of the rectangular-shaped second metal plate 12. With the diagonal corners, the IC tag 1 can transmit circularly polarized waves.

Figure 17:
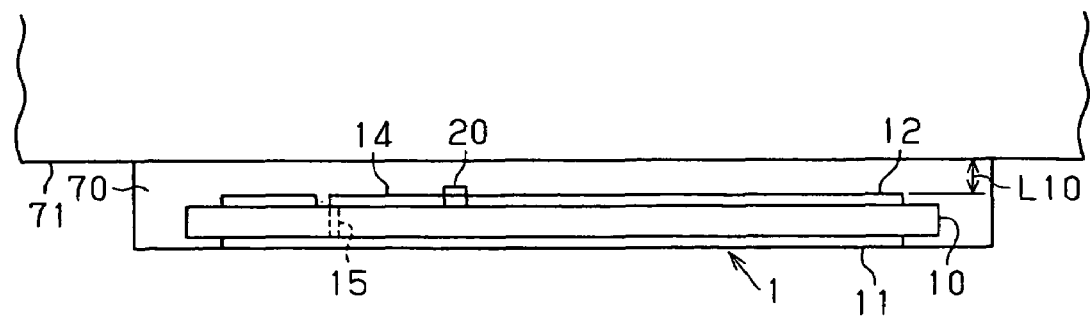
FIG. 17 is a cross sectional view showing an attachment structure of an IC tag of the present invention.
Figure 18:
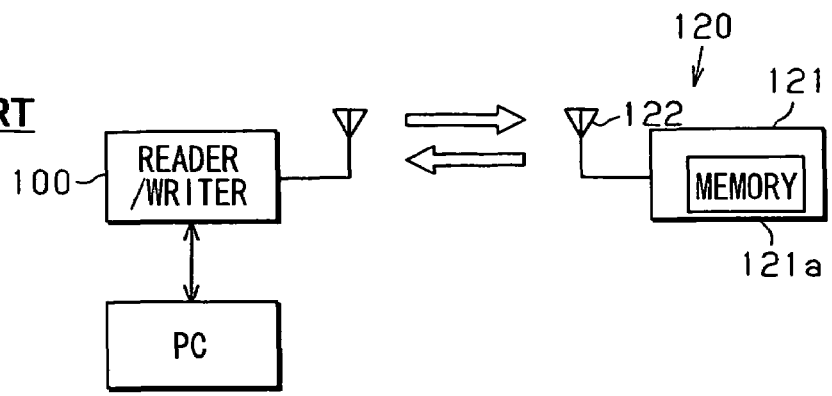
FIG. 18 is a schematic view of an RFID system.
Figure 19:
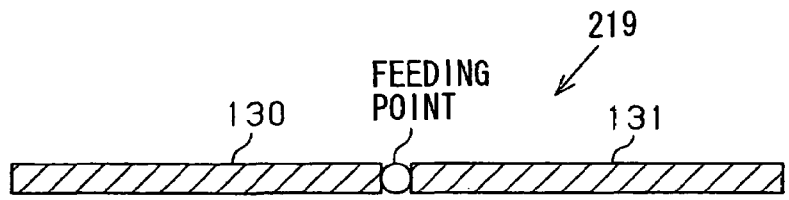
FIG. 19 is a schematic view showing a dipole antenna.
Figure 20A:
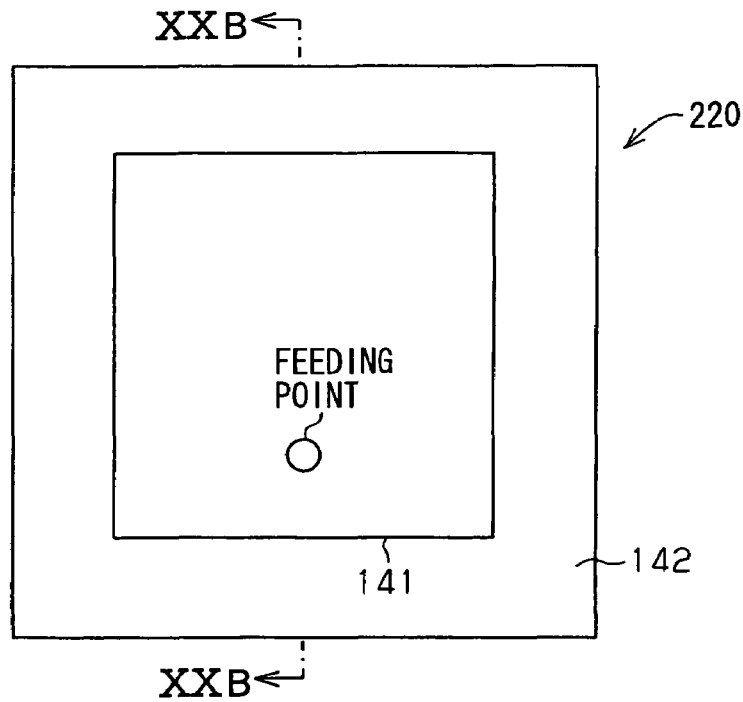
FIG. 20A and FIG. 20B are a top view and a sectional view showing a patch antenna.
Figure 20B:
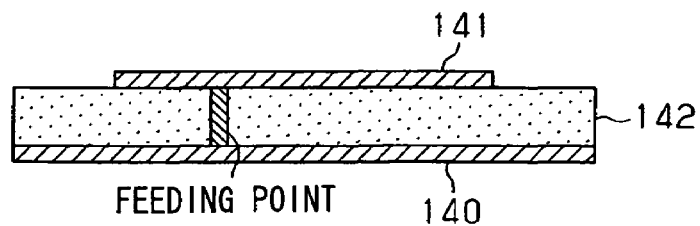
Figure 21:
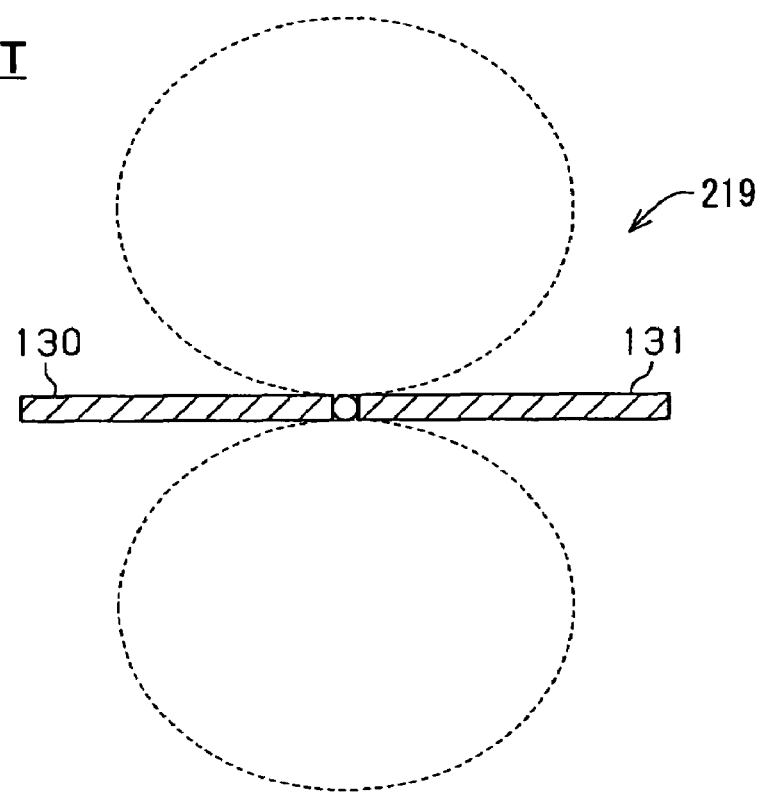
FIG. 21 is a front view showing directivity of the dipole antenna.
Figure 22:
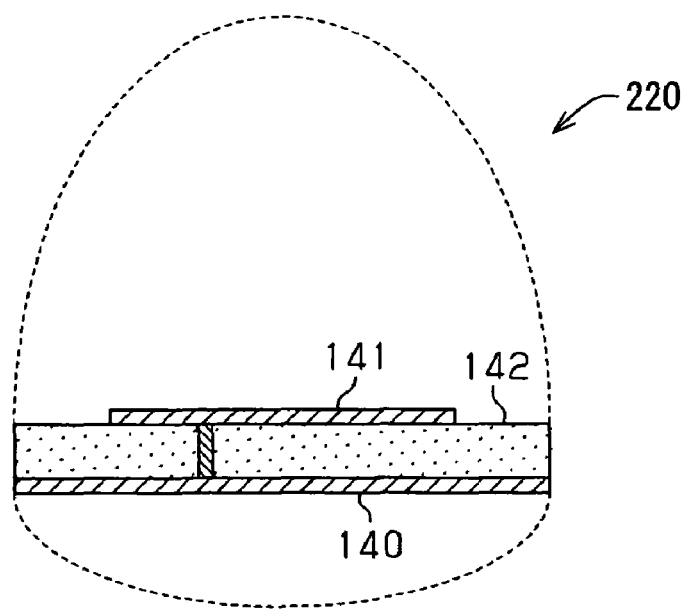
FIG. 22 is a front view showing directivity of the patch antenna.
Figure 23:
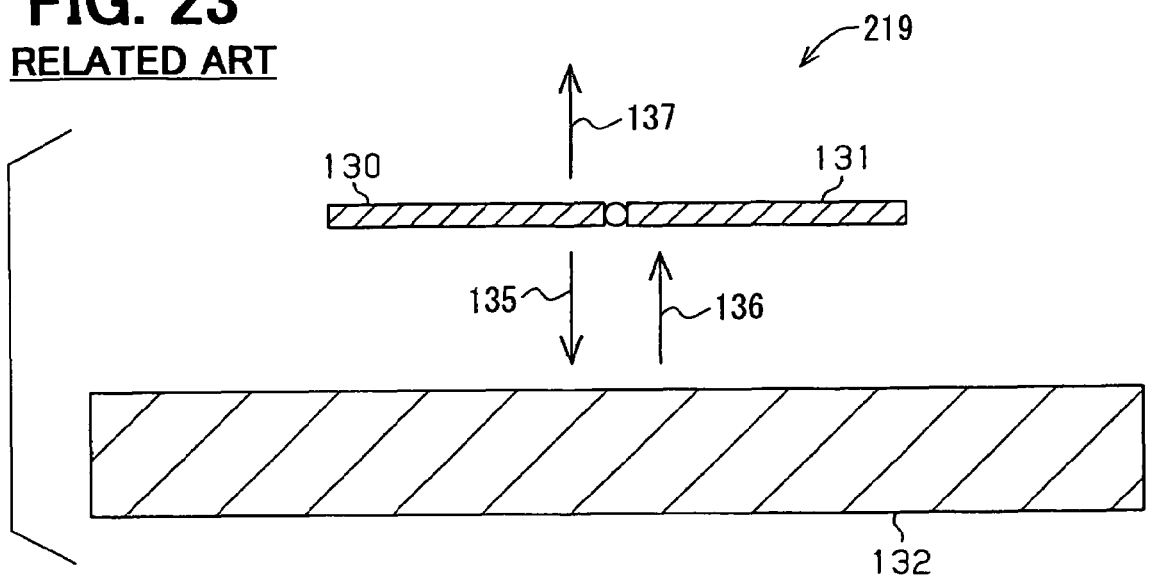
FIG. 23 is a front view showing transmission of electric waves from the dipole antenna on a metal.
Figure 24:
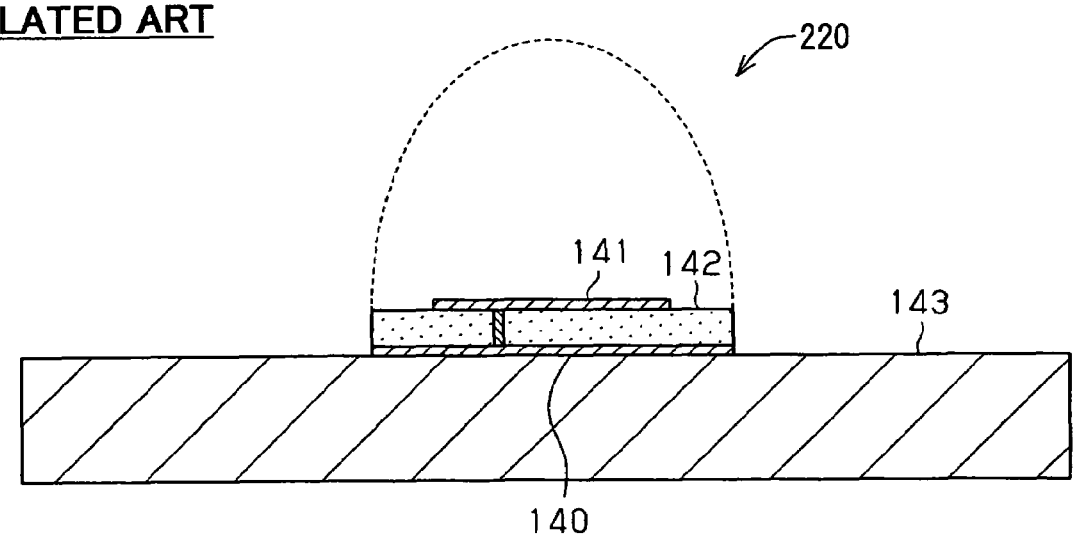
FIG. 24 is a front view showing transmission of electric waves from the patch antenna on a metal.

Furthermore, an IC tag attachment structure will be explained below. As shown in FIG. 7, when the IC tag 1 is attached on the metal 30, the surface of the dielectric body 10 where the first metal plate 11 is located faces the metal 30 and the first metal plate 11 is in close contact with the metal 30. On the other hand, as shown in FIG. 17, the IC tag 1 can be located, with the surface of the dielectric body 10 where the second metal plate 12 and the metal plate 14 are located facing a metal 71. In this case, the IC tag 1 is located with the second metal plate 12 apart from the metal 71 (i.e., the IC tag 1 is located on the metal 71 with an interval between the second metal plate 12 and the surface of the metal 71). Specifically, the dielectric body 10, the second metal plate 12, the metal plate 14, and the IC chip 20 is molded with a plastic 70 so that the interval between the surface of the second metal plate 12 and the surface of the plastic (i.e., a thickness of the plastic 70 above the second metal plate 12) becomes a predetermined value L10. Thus, the IC tag 1 is attached to the metal 71 with the second metal plate 12 facing and being apart from the metal 71, by being molded with the plastic 70.

Likewise, when the IC tag 1 is attached to a dielectric material with the second metal plate 12 facing the dielectric material, the second metal plate 12 is located apart from the dielectric material by a predetermined interval. Thus, it is possible to suppress performance deterioration of the IC tag 1 caused by impedance mismatch, by locating the IC tag 1 with the second metal plate 12 facing and being apart from the metal 71 or the dielectric material.

What is claimed is:

1. An IC tag, comprising:
   a dielectric body having a shape of a plate;
   a first transmission metal plate for transmission fixed to a first surface of the dielectric body;
   a second transmission metal plate for transmission fixed to a second surface of the dielectric body for constituting an antenna together with the first transmission metal plate, wherein both outer edges of the first transmission metal plate and the second transmission metal plate face each other via the dielectric body with a misalignment of λ/30 or less in a direction parallel with the first and second surfaces of the dielectric body, wherein the value λ is a wavelength of an electric wave in the dielectric body, wherein the second transmission metal plate includes a hole;
   a matching metal plate for matching fixed to the dielectric body within the hole, forming a slit together with an inner surface of the hole, and being electrically connected with the first transmission metal plate via a through hole penetrating the dielectric body; and
   an IC chip surface-mounted to connect the second transmission metal plate with the matching metal plate over the second surface of the dielectric body.

2. The IC tag according to claim 1, wherein:
   the first transmission metal plate and the second transmission metal plate are formed of a same material and have a same thickness; and
   the first transmission metal plate, the second transmission metal plate, and the matching metal plate are closely-attached to the dielectric body.

3. The IC tag according to claim 1, wherein the matching metal plate is smaller than the second transmission metal plate.

4. The IC tag according to claim 1, wherein the matching metal plate has a linear shape.

5. The IC tag according to claim 1, wherein the matching metal plate has a bended shape.

6. The IC tag according to claim 1, wherein the matching metal plate has a curved shape.

7. The IC tag according to claim 1, wherein the second transmission metal plate has a rectangular planer shape with a diagonal corner of the second transmission metal plate cut off.

8. The IC tag according to claim 1, wherein the IC tag is attached to one of a metal and a dielectric material, with the first transmission metal plate closely-attached to the one of the metal and the dielectric material.

9. The IC tag according to claim 1, wherein the IC tag is attached to one of a metal and a dielectric material, with the one of the metal and the dielectric material facing the second transmission metal plate with an interval.

10. An IC tag attachment structure, comprising: the IC tag according to claim 1; and one of a metal and a dielectric material to which the IC tag is attached, wherein the first transmission metal plate of the IC tag is closely-attached to the one of the metal and the dielectric material.

11. An IC tag attachment structure, comprising: the IC tag according to claim 1, and one of a metal and a dielectric material to which the IC tag is attached, wherein the one of the metal and the dielectric material faces the second transmission metal plate with an interval.

* * * * *